(12) United States Patent
Wuerstlein et al.

(10) Patent No.: US 8,421,482 B2
(45) Date of Patent: Apr. 16, 2013

(54) ANTI-PINCHING DEVICE

(75) Inventors: Holger Wuerstlein, Zeil am Main (DE);
Thomas Weingaertner, Memmelsdorf
(DE); Wolf-Christian Mueller, Coburg
(DE)

(73) Assignee: **Brose fahrzeugteile GmbH & Co.
Kommanditgesellschaft**, Coburg (DE)

( * ) Notice: Subject to any disclaimer, the term of this
patent is extended or adjusted under 35
U.S.C. 154(b) by 807 days.

(21) Appl. No.: 12/438,710

(22) PCT Filed: Jul. 28, 2007

(86) PCT No.: PCT/EP2007/006697
§ 371 (c)(1),
(2), (4) Date: Nov. 30, 2009

(87) PCT Pub. No.: WO2008/025422
PCT Pub. Date: Mar. 6, 2008

(65) Prior Publication Data
US 2010/0287837 A1 Nov. 18, 2010

(30) Foreign Application Priority Data
Aug. 30, 2006 (DE) .................. 20 2006 013 335 U

(51) Int. Cl.
*G01R 27/26* (2006.01)
(52) U.S. Cl.
USPC ........... 324/663; 324/519; 324/661; 324/658;
324/688; 340/545.4; 340/562; 318/662; 318/817;
73/862.626; 73/335.04; 73/862.337
(58) Field of Classification Search ............... 318/466,
318/280, 266, 268, 817, 794, 662; 73/862.626,
73/760, 780, 335.04, 862.337; 324/663,
324/659, 519, 382, 661, 658, 688; 340/562,
340/570.37, 545.4; 345/173; 331/110, 177 V;
361/181, 270, 283.3; 438/379; 320/166;
327/61; 388/919; 257/312
See application file for complete search history.

(56) References Cited

U.S. PATENT DOCUMENTS

| 4,453,112 | A | * | 6/1984 | Sauer et al. | 318/281 |
| 5,446,444 | A | * | 8/1995 | Lease | 340/514 |
| 6,337,549 | B1 | * | 1/2002 | Bledin | 318/466 |
| 6,445,294 | B1 | * | 9/2002 | McDonnell et al. | 340/562 |

(Continued)

FOREIGN PATENT DOCUMENTS
DE 40 06 119 A1 8/1991
(Continued)

*Primary Examiner* — Antony M Paul
(74) *Attorney, Agent, or Firm* — Muncy, Geissler, Olds & Lowe, PLLC

(57) ABSTRACT

An anti-pinching device (18) for a pivotable actuating element (6) of a motor vehicle (2) is specified. Said device comprises a capacitive sensor (8) which is intended to contactlessly detect an obstacle in the path of the actuating element (6) and has an electrode (14) for generating an external electric field opposite a counterelectrode (16), wherein the electrode (14) extends in a radial direction (R) of the pivoting movement of the actuating element (6), and a control unit (10) which is set up to interpret a change in a measurement capacitance (CM), which is formed between the electrode (14) and the counterelectrode (16), as pinching when the changed measurement capacitance (CM) exceeds a triggering threshold (A) which is predefined on the basis of an opening angle (φ) of the pivotable actuating element (6) and to track the triggering threshold (A). In order to achieve greater detection reliability of the anti-pinching device (18), the electrode (14) is subdivided into a plurality of segments (12) along the radial direction (R), wherein the control unit (10) is set up to track the triggering threshold (A) in a manner assigned to segments.

25 Claims, 3 Drawing Sheets

U.S. PATENT DOCUMENTS

| | | | |
|---|---|---|---|
| 6,583,676 B2 * | 6/2003 | Krah et al. | 331/74 |
| 6,972,575 B2 * | 12/2005 | Lambert et al. | 324/658 |
| 7,046,129 B2 * | 5/2006 | Regnet et al. | 340/438 |
| 7,116,117 B2 * | 10/2006 | Nakano et al. | 324/688 |
| 2003/0085679 A1 | 5/2003 | Bledin et al. | |
| 2004/0172879 A1 | 9/2004 | Regnet et al. | |
| 2006/0117862 A1 | 6/2006 | Shank et al. | |

FOREIGN PATENT DOCUMENTS

| | | |
|---|---|---|
| EP | 1 154 110 A2 | 11/2001 |
| EP | 1 154 112 A2 | 11/2001 |
| EP | 1 277 907 A2 | 1/2003 |
| EP | 1 455 044 A2 | 9/2004 |
| WO | WO 2006/032357 A2 | 3/2006 |

* cited by examiner

ANTI-PINCHING DEVICE

This application is a national stage of International Application No.: PCT/EP2007/006697, which was filed on Jul. 28, 2007, and which claims priority to German Patent Application No.: 20 2006 013 335.6, which was filed in Germany on Aug. 30, 2006, and which are both herein incorporated by reference.

The invention relates to an anti-pinch device for a pivotable actuating element of a motor vehicle, comprising a capacitive sensor for the non-contact detection of an obstacle in the path of the actuating element with an electrode for generating an external electric field relative to a counter electrode, whereby the electrode extends in a radial direction of the pivoting movement of the actuating element, and a control unit, which is set up to interpret a change in a measurement capacitance formed between the electrode and the counter electrode as a case of pinching when the changed measurement capacitance exceeds a triggering threshold predefined as a function of an opening angle of the pivotable actuating element, and to track the triggering threshold.

Known anti-pinch devices utilize sensors in particular that are built based on the capacitive measuring principle to detect an obstacle. In this case, an electric field is created between an electrode and a suitable counter electrode. If a dielectric enters this electric field, i.e., a foreign body, the capacitance of the capacitor formed by the electrode and the counter electrode changes. In this way, theoretically any obstacle in the path of an actuating element of a motor vehicle can be detected with a relative dielectric constant $\in_r$ different from the relative dielectric constant of air. The obstacle in the path of the actuating element is detected without physical contact by the sensor. If a change in capacitance is detected, countermeasures, such as, for example, stopping or reversing of the drive of the actuating element, can be initiated in a timely fashion, before an actual pinching of the obstacle occurs.

Non-contact anti-pinch sensors, based on the capacitive measuring principle, are known, for example, from European Pat. Applications Nos. EP 1 455 044 A2 and EP 1 154 110 A2. Both sensors generate an external electric field by means of an electrode and a suitable counter electrode, so that a dielectric entering this external electric field may be detected as a change in capacitance between the electrode and counter electrode.

If during the closing of the actuating element, the electrode of the sensor and the body or a body part of the motor vehicle move toward each other, the capacitance of the capacitor formed by the electrode and body increases. If the counter electrode of the sensor is formed by the body, the capacitance course dependent on the position of the actuating element must be considered to avoid misinterpretation as a case of pinching. To this end, the capacitance course of a pivotable actuating element is usually measured via the opening angle of the actuating element and stored for compensation. For similar actuating elements, this can also be predefined, implemented fixedly in the control unit, for example, from the course determined from a test arrangement.

To detect a case of pinching, in prior-art anti-pinch devices, proceeding from the measured capacitance course, a triggering threshold dependent upon the opening angle is predefined and when the currently measured capacitance exceeds said threshold a case of pinching is interpreted. Mechanical tolerances, temperature-induced variations in distance, or dirt deposits, however, lead to a change in the actual capacitance course via the opening angle. So that this type of change does not lead to an undesired misinterpretation as a case of pinching and therefore in a troubling stopping or reversing of the actuating element, without there being an obstacle in the path of travel, it is necessary to determine the capacitance course after the initial assembly and during operation at certain time intervals and to track or update the triggering threshold accordingly.

In a disadvantageous manner, the triggering threshold of a pivotable actuating element relevant for a case of pinching, such as, for example, an electrically actuatable trunk lid, an electrically actuatable engine hood, or an electrically actuatable vehicle door, has a relatively large dependence on the opening angle over the entire path of travel. This easily causes misinterpretations and therefore an undesirable stopping or erroneous reversing of the actuating element. In particular, small changes in the geometry or dirt along the closing edge can result in a no longer tolerable change in the capacitance course, so that frequent tracking of the triggering threshold is necessary.

The object of the invention is to provide an anti-pinch device of the aforementioned type for a pivotable actuating element, which is notable for the highest detection reliability possible. Further, it is an object of the invention to provide a suitable evaluation circuit for the anti-pinch device, which enables the highest detection reliability possible for the anti-pinch device.

This object is achieved by the invention in that the electrode, oriented along the radial direction, of the sensor is divided into several segments, and that the control unit is set up to track the triggering threshold in a segment-assigned manner.

The invention is based on the consideration that the detection reliability of the anti-pinch device can be increased by assuring a high position resolution of the sensor in the radial direction. This is achieved by dividing the electrode into several segments, it being possible to measure the capacitance of each segment individually.

Due to the separate measurement of capacitance of the individual segments, it is possible to determine an assigned capacitance course in each case for the different segments as a function of the opening angle. In other words, the invention makes it possible to determine or establish the capacitance course to be found for establishing a triggering threshold not only as a function via the opening angle but also as a function of the radial distance to the axis of the pivoting movement. This increases the spatial resolution of the triggering threshold and the detection reliability of the entire system is thereby improved overall. For example, a mechanical deformation of a radially outer part of the actuating element no longer influences the capacitance of a radially inner sensor segment, so that its triggering threshold need not be tracked in this regard. Different tolerance ranges around the triggering thresholds can also be predefined for different segments. In so doing, the fact can be taken into account that less time is provided for a radially outer obstacle due to the increased path speed until a case of pinching [occurs] than for a radially inner obstacle. The radial resolution of the triggering threshold also makes it possible to eliminate the high dependence on the opening angle at least for radially outer segments. The capacitance course of a radially outer segment, in contrast to that of a radially inner segment, exhibits no dependence on the opening angle at large opening angles. For a radially outer segment, initially the distance between the sensor electrode and the opposing closing edge, which as a body part forms a counter electrode, is still negligibly small for a change in the measurement capacitance due to proximity.

This knowledge is used to control the segments by assigning the triggering thresholds or capacitance courses to segments and tracking the triggering thresholds of the segments separately. The separate tracking of these triggering thresholds of the individual segments can be realized at justifiable technical cost; overall the risk of an erroneous reversing is considerably minimized.

As a rule, the change in capacitance caused by a foreign body entering the path of an actuating element is small. This type of change in capacitance can be detected the better, however, the smaller the capacitance forming overall between the electrode and counter electrode. The present segmentation of the electrode accordingly offers the further advantage that the detection sensitivity is increased. It is the case here that the higher the number of segments, the higher the detection sensitivity of both the individual segments and the sensor.

Furthermore, a capacitive sensor designed in this way basically allows the detection of a change in capacitance by means of a multiplex process. In this case, the individual segments can be controlled by means of separate feed lines either displaced in time (serially) or simultaneously (parallel). The first serial control offers the advantage that in this case only a single evaluation circuit is necessary for the capacitance change. Nevertheless, the time constant must be considered here until all segments have been connected through one after another. The second parallel control in fact does not have the disadvantageous time delay, but requires several evaluation electronics for evaluation, which increases the cost.

The tracking of these segment-assigned triggering thresholds can be performed during system operation. In particular, the triggering threshold can be automatically determined later. The triggering threshold can be adjusted particularly to compensate for the aging of the system.

According to a preferred embodiment, the control unit is set up to track the triggering threshold of the individual segments at different time intervals. To this end, control of the individual segments can occur depending on their measuring signal. In particular, the triggering threshold of segments that exhibit a great capacitance variation via the opening angle is tracked at short time intervals, so that a small change in the capacitance course is not wrongly interpreted as an encroaching obstacle. Accordingly, it is sufficient to track less often the triggering threshold of segments that have any small variation in capacitance via the opening angle.

According to another preferred embodiment, the control unit is set up to track the triggering threshold of radially inner segments at shorter time intervals than the triggering threshold of radially outer segments. In this case, the realization is implemented that during closing of the pivotable actuating element the different regions of the actuating element in the radial direction, despite the same opening angle, are at a different distance to the opposing closing edge. The radially inner regions of the pivotable actuating element are essentially closer to the opposing closing edge than the radially outer regions. Thus, the radially inner segments are subject to a greater risk of a change in measurement capacitance, because the geometry or the property of the opposing closing edge is always included in the measurement capacitance. The measurement capacitance of the radially inner segments always depends on the closing angle. The measurement capacitance of the radially outer segment, in contrast, no longer exhibits a dependence on the closing angle especially at large closing angles. The risk of an erroneous reversing during the closing process is therefore efficiently countered by the more frequent tracking of the triggering threshold of the radially inner segments.

At very small opening angles, particularly in the radially inner region of the electrode, the measurement capacitance of the capacitor can become so large that it is barely possible for a change in capacitance due to an obstacle to be detected. To avoid the risk of an erroneous reversing and to relieve the control unit at least in part, for this reason, preferably individual segments are turned off depending on the opening angle. In particular, radial inner segments are turned off earlier, i.e., at a larger opening angle, than radially outer segments. Here, the risk of pinching in the radially inner region can be more likely regarded as low, because starting at a certain small opening angle an obstacle can no longer penetrate into the limited path of travel. Nevertheless, to be able to detect a case of pinching, an obstacle can be detected, for example, by means of a tactile sensor.

The tracking of the triggering threshold can occur basically in different ways. On the one hand, it is conceivable that the control unit detects the actual capacitance course at regular intervals during an opening or closing process and adjusts the stored course or the triggering threshold derived herefrom accordingly to the actual course. Expediently, because it is relatively cost-effective, the tracking can also occur in an electronic manner by means of suitable electronic switching means. It is achieved by switching means of this type that the control unit in a case of pinching is always supplied with a definite, particularly digital measuring signal, namely independent of the actual capacitance course. This can occur by different means depending on the evaluation circuit to detect the measurement capacitance. If the measurement capacitance is detected, for example, by means of a bridge circuit, it is an option to connect in parallel a second bridge branch of similar design and to detect as the measuring signal the difference of the voltages tapped between the resistance and capacitance, or their amplitudes or opposite phase position. If the measurement capacitance deviates from the reference capacitance, the differential signal becomes different from zero, so that a pinching signal can be easily differentiated from the standard signal, for example, by means of a comparator, and a digital signal is supplied to the control unit. The use of a controllable capacitance, particularly a controllable capacitance diode is an option for adjusting the two bridge branches. By regulating the capacitance diode by means of a control unit, it is possible to readjust a changed triggering threshold or a changed capacitance course or to detect the triggering threshold.

To avoid erroneous detection of an obstacle, the triggering threshold during a closing or opening process of the actuating element is tracked in such a way that the difference between the signal of the measurement capacitance and that of the reference capacitance does not exceed the triggering threshold also with an increasing change in capacitance during the closing of the actuating element. In other words, the reference capacitance is controlled according to the change in measurement capacitance during the opening or closing process. Alternatively, the tracking of the triggering threshold can occur based on software by predefining a higher triggering threshold for increasingly smaller opening angles of the actuating element, so that it is not exceeded by the differential signal, also with constantly increasing difference between the measuring and reference signal.

The tapped voltage of the measurement and reference capacitance depends in addition on the resistance in both measurement branches. An adjustment of the measured voltage signal of the reference capacitance therefore cannot occur only by a corresponding adjustment of the capacitance itself but also by variation of the resistance. In this case, the control unit is preferably set up in such a way to regulate a controllable series resistor for tracking the triggering threshold. For this purpose, a variable resistance, which is tracked by the control unit for adjusting the changed measurement capacitance, is provided at least in the reference branch of the bridge circuit.

Alternatively, the measurement capacitance can be detected by means of a tank circuit resonance or tank circuit detuning. In this case, the control device is advantageously set up to adjust a resonance frequency for detecting the triggering threshold, because now due to the changed capacitance a changed resonance frequency corresponds to a case of pinching.

According to a preferred embodiment, the control unit is set up to predefine the triggering threshold as a distance value to the capacitance course of the measurement capacitance as a function of the opening angle. The triggering threshold therefore represents a limit of a tolerance range over the capacitance course, in which tolerance range a change in capacitance is not interpreted as an obstacle. Hereby, the triggering threshold depends functionally on the capacitance course, and its tracking occurs indirectly via the capacitance course of each sensor segment.

According to another preferred embodiment, the control unit is set up to track the distance value. In this case, the distance value is adjusted directly depending on the opening angle, without it having to be represented as a function of the capacitance course. This means that once the capacitance course is known depending on the opening angle of each individual segment, an angle-dependent course of the distance value is determined, which is stored, e.g., in the form of a mathematical correlation or a lookup table. This course can then be updated to the actual conditions. In particular, the distance value can be different in a segment-assigned manner to create therefore a variably sensitive sensor region. Of course, the capacitance course or the triggering threshold itself can also be stored as a function via the opening angle in the form of a mathematical correlation or in the form of a lookup table, whereby the correlation or the lookup table is changed for tracking.

Advantageously, the electrode is carried in a flexible carrier. This type of carrier permits adjustment of the sensor to the given contours of a motor vehicle. In particular, the sensor can be formed overall as a flexible flat cable. It is also conceivable to design the sensor as a sealing body or to integrate the sensor into a sealing body. The sealing body is provided thereby to seal the actuating element relative to the closing edge in a closed state.

A flexible flat cable is also called an FFC and is notable in that parallel conductor structures are placed in a flexible cable body. As an alternative to an FFC, a flexible conductor structure may also be used. A flexible conductor structure is also known under the term FPC (Flexible Printed Circuit). In this case, traces are specifically arranged or laid out in a flexible insulating material, particularly in a multilayer arrangement. This type of design permits high flexibility with respect to the dimensioning and arrangement of the individual traces.

It is advantageous, furthermore, if a shielding electrode is provided in addition in the flexible carrier to direct the electric field into a hazard region. The electrode and the shielding electrode are arranged substantially opposite and isolated from one another. In this case, the shielding electrode is at the same potential as the electrode. If this type of shielding electrode is inserted between the electrode and counter electrode, the electric field forming between the electrode and shielding electrode and thereby a direct capacitance are considerably reduced. Due to this design, an electric field, which is directed far into the space, forms like a stray-field capacitor between the electrode and the counter electrode. The detection space or the range of the sensor is considerably increased as a result.

Expediently, the shielding electrode is also divided into electrically contacted shielding segments, between which separate feed lines are arranged in an isolated manner. In this way, it is reliably avoided that a capacitance is formed between the feed lines and the counter electrode. Each line is shielded from the counter electrode in this manner.

According to a preferred variant, the anti-pinch device comprises in addition a tactile sensor. The tactile sensor is provided as a type of backup sensor, which is to detect an obstacle also in the case of a disturbance function or when the segments of the non-contact sensor are turned off. The tactile sensor can also be built based on a capacitive measuring principle. Here, upon contact, for example, based on a force or pressure effect caused by the contact, it shows a change in capacitance which is detected and evaluated by the control unit. Like the non-contact sensor, the tactile sensor is also divided in particular into different segments or segment groups.

According to another preferred variant, which is notable for a low space requirement, the non-contact sensor is designed at the same time as a tactile sensor. This type of combination non-contact and tactile sensor can be made by providing a ground electrode and an internal electrode in addition to the electrode, the counter electrode, and the shielding electrode, whereby the shielding electrode and the internal electrode are separated from one another by the ground electrode, which is connected to the ground potential. At least the ground electrode and internal electrode are embedded in an electrically insulating, elastic material. The unit, comprising the ground electrode, the internal electrode, and the elastic material arranged between the electrodes, forms a tactile capacitive sensor. Hereby, the capacitance formed between the internal electrode and the ground electrode is used for the tactile detection of an obstacle. If there is a force effect on the sensor by an external obstacle, the elastic material is compressed and its thickness changes. Thus, the distance between the internal electrode and ground electrode changes, which results in a detectable change in capacitance of the tactile capacitive sensor. Thus, contact of the sensor by the obstacle is detected.

If the non-contact detection fails, detection of an obstacle still occurs as a result of the detection of the mechanical effect on the sensor, as a result of which the capacitance formed between the internal and the ground electrode changes.

The sensor can be used in a simple manner to detect an obstacle in the path of an actuating element of a motor vehicle, when the grounded body of the motor vehicle serves as the counter electrode. To this end, the described sensor is run along the contours of the motor vehicle in such a way that the shielding electrode comes to lie between the body and the electrode. The evaluation circuit in this case detects the capacitance formed between the electrode and the grounded body. The sensor is preferably arranged on a movable part of the actuating element, for example, on the trunk lid of the motor vehicle, but it can also be arranged on a body region opposite the trunk lid.

The second object is achieved according to the invention by an evaluation circuit, which comprises measuring potential output means to output a predefined measuring potential to the electrode, capacitance detection means to detect the measurement capacitance between the electrode and the counter electrode, and evaluation means to output a detection signal as a function of the change in the measurement capacitance.

The measuring potential output means are used to generate a measuring potential which is necessary for detecting the measurement capacitances and which is applied at the electrodes. For this purpose, the measuring potential output means may comprise, for example, a DC voltage generator or AC voltage generator. Thus, a measurement capacitance can be detected, for example, by means of a charging time evaluation via a DC voltage generator. An AC voltage generator enables detection of the measurement capacitances via its complex resistance or AC resistance by means of a voltage divider. A controllable AC voltage generator also enables the detection of the measurement capacitances via phase mismatching. The measuring potential output means can also be designed to be able to detect the measurement capacitances via tank or resonant circuit detuning.

The capacitance detection means can be realized by electronic components. In particular, however, signals can also be digitized and compared to one another by means of a computer, subjected to a logic operation, or processed in some other way, to be able to determine as a measuring signal a change in the distance or the difference in the measurement capacitances to one another.

The evaluation means are designed to conclude from the detected measuring signal that there is a case of pinching and in such a case to generate a corresponding detection signal. The evaluation means may also be realized by means of electronic components or by suitable software and an appropriate computer.

Preferably, the measuring potential output means comprise an AC voltage source and the capacitance detection means comprise a bridge circuit, whereby the measurement capacitance in the bridge branch is connected parallel with a controllable capacitance diode. An AC voltage of the desired value and frequency is applied by means of the measuring potential output means between the electrode and counter electrode. The difference in measurement capacitances can then be formed, for example, by detection of the corresponding AC voltage resistances. In addition, the capacitive detection means each comprise a bridge circuit, the measurement capacitances in the bridge branches being connected in parallel. Thus, a differential signal, which corresponds to the difference in measurement capacitances, can be determined in a manner relatively simple in terms of circuitry by tapping of the voltages declining at the measurement capacitances or by a phase or amplitude difference in voltages in the two bridge branches. Here, a differential amplifier is an option which forms the difference of the voltages dropping at the capacitances. For this purpose, peak value detection, for example, can be connected upstream of the differential amplifier.

The exemplary embodiments of the invention are explained in greater detail with use of a drawing. Here, the figures show FIG. 1 shows schematically a side view of a motor vehicle;

The same reference parts have the same meaning in the various figures.

Figure 1:
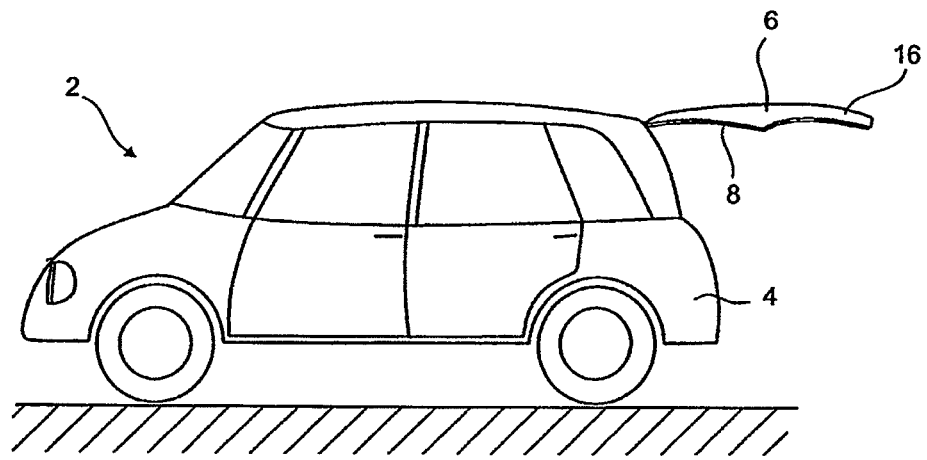

FIG. 1 shows schematically a side view of a motor vehicle 2 with a body 4 and an open trunk lid 6. Trunk lid 6 represents a pivotable actuating element, which is controlled by a control unit and is driven electrically by a motor. During closing of trunk lid 6, it must be assured that there is no obstacle within its area of motion, also called the hazard region hereinafter. For this purpose, a sensor 8 formed in particular as a flat cable is affixed along the side edges and along a lower rim of trunk lid 6. In sensor 8, several segments (not shown here) of an electrode (see FIG. 6), which have separate feed lines for control, are located along the radial direction of the pivoting movement. The frame of trunk lid 6, said frame connected to grounded body 4 of motor vehicle 2, is used as counter electrode 16. Control unit 10 is integrated in particular into the door electronics or into the control electronics of motor vehicle 2. Sensor 8, the control unit, and motor together form an anti-pinch device for detecting an obstacle in the path of pivotable trunk lid 6.

Figure 2:
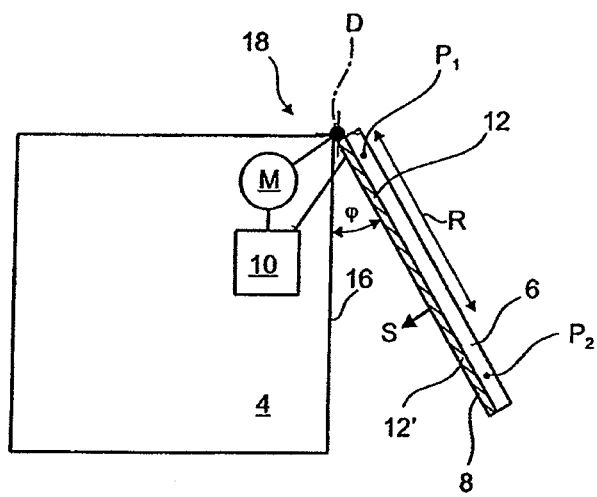
FIG. 2 shows in a highly simplified diagram a side view of a trunk lid of a motor vehicle.

The movement of trunk lid 6 during closing is shown in FIG. 2 in a highly simplified drawing of motor vehicle 2. Trunk lid 6 is arranged pivotably around axis D on body 4, axis D which runs perpendicular to the plane of the drawing and thus appears as a point. Trunk lid 6 extends from point D in a radial direction R. Trunk lid 6 is driven by means of an electric motor M, which is controlled by control unit 10. Control unit 10 to this end is connected to sensor 8 arranged along trunk lid 6.

During closing, trunk lid 6 moves at an average angular speed toward body 4, which applies to all radial regions of trunk lid 6. As is evident from FIG. 2, the different regions of trunk lid 6 are at a different distance from body 4 or the opposing closing edge at the same opening angle $\phi$ depending on the radial distance to axis D. If, e.g., a point $P_1$, which is positioned radially inward, and a point $P_2$, which is positioned radially outward, are compared, then point $P_1$ at the same opening angle is at a smaller distance to body 4 than point $P_2$. This has the result that a radially inner segment 12 of sensor 8, which is arranged along the closing edge of trunk lid 6 according to FIG. 1, at point $P_1$ will measure a higher capacitance than a radially outer segment 12' at point $P_2$.

It can be stated furthermore that the measurement capacitance measured by segments 12 and 12' each have a different capacitance course over the opening angle $\phi$. Thus, the capacitance course of segment 12, which for an open trunk lid 6 as well is closer to body 4 than segment 12', exhibits a steady increase with the start of the closing process of trunk lid 6 with a decreasing opening angle until a maximum value is reached at a closed trunk lid 6. The capacitance course of segment 12', in contrast, at large opening angles $\phi$ initially exhibits no or only a very minor dependence on the opening angle, and has a steeper increase only at small opening angles $\phi$ in the vicinity of counter electrode 15.

Figure 3:
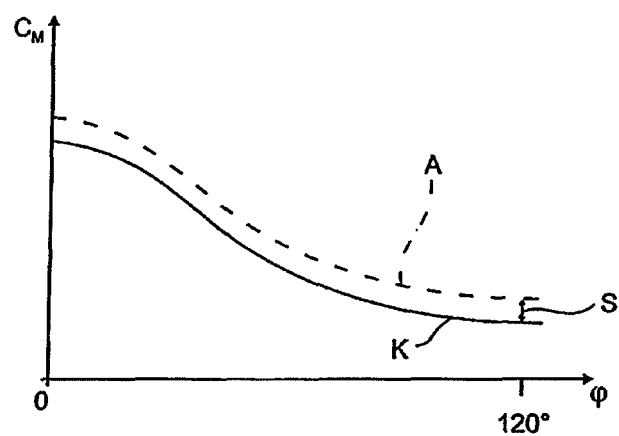
FIG. 3 shows in a diagram an exemplary capacitance course and a course of a triggering threshold as a function of an opening angle.

An exemplary qualitative capacitance course K for one of the segments 12 of electrode 14 is illustrated in FIG. 3. In the diagram according to FIG. 3, a measurement capacitance $C_M$ of the segment is plotted versus the opening angle $\phi$ in an angle range of 0° (trunk lid 6 closed) to 120° (trunk lid 6 open). A dashed line is shown above the curve K, which is the capacitance curve; said dashed line follows the course of curve K and always runs at the same distance S above curve V [sic, K]. The dashed line indicates a distance value and forms the course of a triggering threshold A as a function of the opening angle $\phi$. When the measurement capacitance $C_M$ for a certain angle $\phi$ exceeds the triggering threshold A, control unit 12 interprets this as an obstacle in the path of trunk lid 6. Accordingly, the range between the capacitance course K and the triggering threshold A represents a tolerance range, whereby a change in capacitance within this tolerance range does not result in the reversing of trunk lid 6.

This type of capacitance course K is prepared for each segment 12 of electrode 14, which results in a high position resolution or in a high detection reliability of sensor 8. The curve of the capacitance course K is determined and stored, for example, during a calibration process and can be used as a basis for determining the triggering threshold A.

During the operation of trunk lid 6, the measuring signals of segments 12 are evaluated individually, and/or segments 12 are controlled separately. It is also the case that the triggering thresholds A of segments 12 are adjusted or tracked differently. In particular, the triggering thresholds A of individual segments 12 are often tracked differently. For a segment 12, which is close to the axis D, e.g., in the area of point $P_1$, due to the great variation in the measurement capacitance $C_M$ over the opening angle $\phi$, frequent setting of a new triggering threshold A adjusted to the actual course is necessary. In other respects, for a segment 12', which is radially distant from the axis D, e.g., a segment 12, which according to FIG. 2 comprises point $P_2$, the updating of the triggering threshold A within the range of a large opening angle $\phi$ is performed at somewhat longer time intervals. In the extreme case, depending on the opening angle $\phi$, some of the segments 12 of electrode 14 can also be completely turned off, e.g., the radially inner segments 12 at very small opening angles $\phi$, at which opening angles $\phi$ due to the high measuring signal a change in capacitance by an obstacle can hardly be determined, or an obstacle can no longer enter the very small gap.

Figure 4:
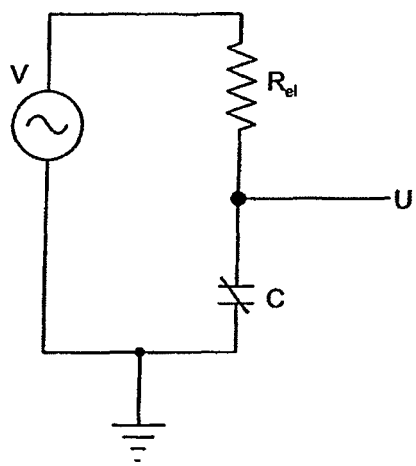
FIG. 4 shows a voltage divider circuit to detect a measurement capacitance.

Different measuring principles can be used to determine the measurement capacitance $C_M$ of segments 12. This can occur, for example, via a bridge circuit by means of an AC voltage at which the voltage drop U is measured from the measurement capacitance, which is connected in series to an ohmic resistance. This type of bridge circuit is shown schematically in FIG. 4. The electric circuit shown there comprises a capacitor C, which is formed by the measurement capacitance, an AC voltage source V, and an ohmic resistance $R_{el}$. The voltage U is tapped between the ohmic resistance $R_{el}$ and the measurement capacitance. Both the amplitude of the voltage U and its phase position are used as a measure for the capacitance.

The measurement capacitance $C_M$ determined in this way is compared with a corresponding triggering threshold A to detect a possible case of pinching. In this case, the triggering threshold A is set either as a function of the opening angle $\phi$, or it is determined mathematically as a function of the capacitance course K, for example, by adding the value of the distance S to the value of the capacitance course V for each opening angle $\phi$. In so doing, the distance value S can also vary with the opening angle $\phi$. The values of the triggering threshold A can be placed, in addition, in the permanent memory, for example, in the form of a lookup table. In the present case, an angle course of the triggering threshold is predefined for each segment 12 of sensor 8 or its electrode. During operation of trunk lid 6, the value of the triggering threshold A is adjusted segment-wise depending on the opening angle $\phi$, whereby the course of the triggering threshold A is different for each segment 12 and the adjustment of the triggering threshold A is often performed differently depending on the segment.

In an alternative measuring principle for determining the measurement capacitance $C_M$, the resonance frequency of a tank circuit containing the measurement capacitance $C_M$ is determined. Thus, the established resonance frequency changes with a change in the measurement capacitance $C_M$. The resonance frequency can be determined, for example, with a controllable AC voltage source (voltage controlled oscillator). To track the triggering threshold, the resonance frequency representing a value for the triggering threshold A is adjusted.

Figure 5:
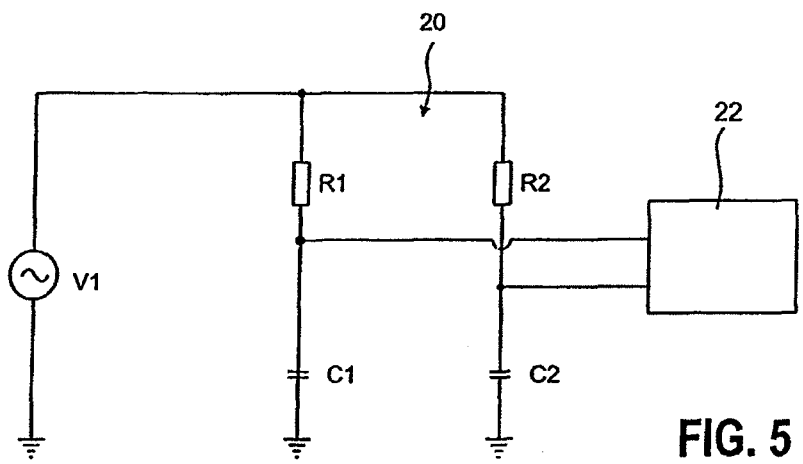
FIG. 5 shows another branch circuit to detect a measurement capacitance.

To determine the measurement capacitance $C_M$ via a bridge circuit, in addition, a controllable capacitance, particularly a capacitance diode, used as a reference capacitance can be provided, as is evident from FIG. 5. FIG. 5 shows an evaluation circuit modified for this purpose by means of a bridge circuit. The evaluation circuit again comprises an AC voltage source V1 for generating a defined AC voltage. Further, the shown evaluation circuit comprises a measuring bridge circuit 20 to detect the measurement capacitances. In this case, measuring bridge circuit 20 is made of two bridge branches, each of which comprises an ohmic resistance R1 or R2 and two capacitances C1 or C2. The capacitance C1 of the first bridge branch in this case is formed by electrode 14 and counter electrode 16 of sensor 8 and thereby represents the actual measurement capacitance. The second capacitance C2 is formed as a reference capacitance, for which purpose a voltage-controlled capacitance diode, operated in the blocking direction, is used.

Via a respective voltage tap between the ohmic resistances R1, R2 and the assigned capacitances C1 or C2, it is possible for a suitably formed evaluation means 22 to form the differential signal corresponding to the difference of measurement capacitances C1, C2 and to derive a detection signal therefrom to establish a case of pinching.

Figure 6:
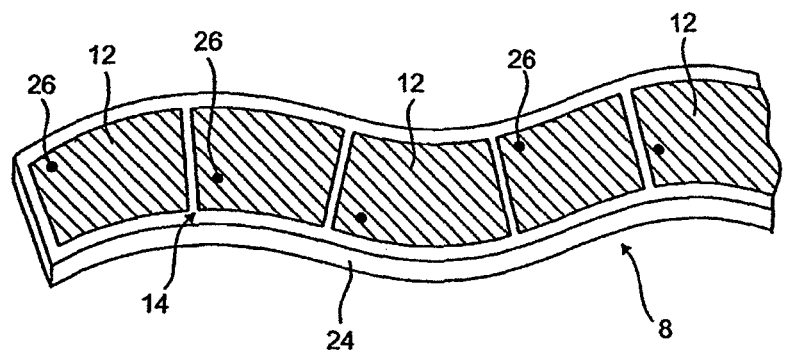
FIG. 6 shows in a plan view a sensor realized by a flexible conductor structures.

In FIG. 6 sensor 8 is shown in a plan view. The flexible conductor structure 24 is evident here, which can be easily run along a contour of motor vehicle 2. To clarify the structure, the insulation material on the top side of sensor 8 has been removed or not drawn. For this reason, individual segments 12 of electrode 14, said segments which are interrupted in the longitudinal direction of the flexible conductor structure 24, are clearly visible. Each of these segments 12 has a through-hole plating 26, connected to a separate line. A multiplex process can be used in this way to evaluate sensor 8. Segments 12 are controlled individually one after another, offset in time, and the capacitance formed as a result is detected. Due to the reduced area of segments 12 compared with a continuous trace, the capacitance between segments 12 and the counter electrode 15 is further reduced. This permits a further increase in the detection sensitivity.

Variations in the size of the individual segments 12 are also possible. Smaller and, in this respect, a plurality of segments 12 per section can be provided here, for example, in a radially inner region compared with a radially outer region of trunk lid 6.

Figure 7:
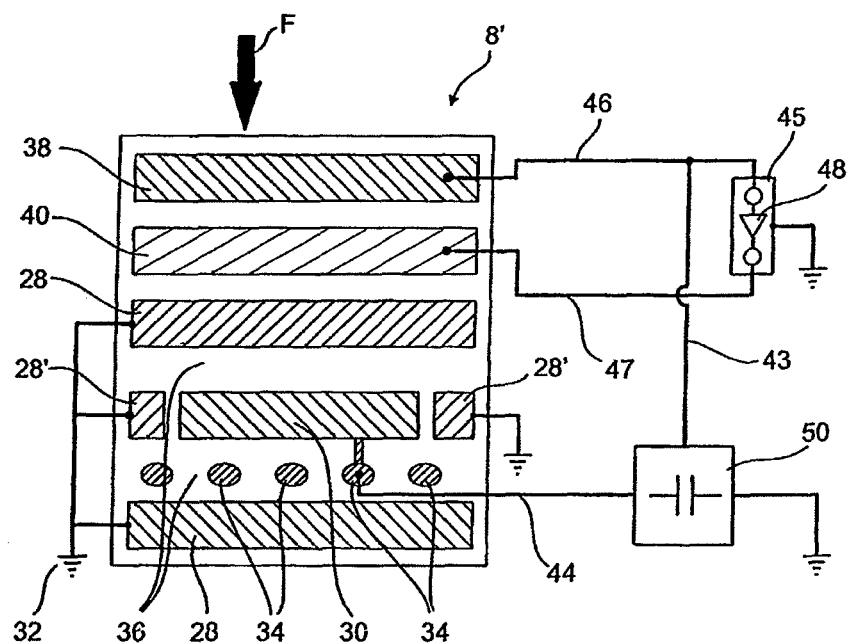
FIG. 7 shows in a cross-section a combination non-contact and tactile capacitive sensor.

The structure of an exemplary sensor 8', which is made as a flat cable and as a multisensor for a non-contact and for tactile detection of an obstacle, is seen in the cross section shown in FIG. 7. Sensor 8' is based in particular on the capacitive measuring principle. Sensor 8' shown in FIG. 7 comprises first the basic structure comprising two outer ground electrodes 28 and a flat internal electrode 30 between the ground electrodes 28. Two flat conductors or traces 28', which are contacted electrically in each case with ground electrodes 28, are arranged in turn on the narrow sides of internal electrode 30. The ground electrode 28, 28' formed overall as a result is connected to a ground potential 32, particularly to ground. In the longitudinal direction of the flat cable, the internal electrode 30 is divided into several segments isolated from one another. One of these segments is included in the shown section. Each of these segments has a separate line 34, by which in each case the capacitance between internal electrode 30 and ground electrode 28 can be measured or evaluated. The separate lines 34 in this case are arranged within an insulating and elastic material 36 separating ground electrode 28 and internal electrode 30.

The basic unit comprising the ground electrode 28, 28', internal electrode 30, lines 34, and the layer arranged between the electrodes and made of elastic material 36 acts as a tactile capacitive sensor. To determine the capacitance between ground electrodes 28, 28' and internal electrode 30, ground electrode 28 is set to a ground potential, particularly to ground, and internal electrode 30, on the contrary, is supplied with an AC voltage.

If a force effect on sensor 8' occurs by an external object in the direction of the shown force vector F, this results in a compression of the layers of elastic material 36. The thickness of elastic material 36 therefore changes. Because the capacitance of the capacitor comprising ground electrode 28 and internal electrode 30 depends on their distance and therefore on the thickness of the insulating material 36, the shown force effect leads to a change in the capacitance, so that it is possible to detect contact with sensor 8'. In this case, a locally limited force in sensor 8' extending as a flat cable is sufficient to cause a detectable change in capacitance.

To evaluate sensor 8' as a tactile sensor, the segments of an internal electrode 30 are connected via their separate lines 34 by means of a connecting line 44 to an evaluation circuit 50, which is connected to a control unit. Thus, the control unit with the aid of evaluation circuit 50 records a change in capacitance between ground electrode 28 and the particular segment of internal electrode 30. If the distance between the top and bottom ground electrode 28 and internal electrode 30 changes, a change in capacitance results, which indicates a force or pressure effect at the site of the evaluated segment. In particular, a position resolution of the tactile capacitance sensor 8' can be achieved by a serial evaluation of the segments of internal electrode 30.

In addition, sensor 8' according to FIG. 7 comprises electrode 38, which is again formed as a flat conductor and is arranged opposite to top ground electrode 28. A shielding electrode 40, also formed as a flat conductor, is arranged between electrode 38 and top ground electrode 28. Electrodes 38 and 40 are embedded in insulating material 36. The structural unit, consisting of top ground electrode 28, shielding electrode 40, and electrode 38 operates as a non-contact proximity sensor based on the capacitive measuring principle, which will be described hereinafter.

To utilize sensor 8' as a non-contact proximity sensor, electrode 38 is supplied with an AC voltage by means of signal line 46. The AC voltage in this case is generated by signal generator 45 relative to the ground potential. Further, shielding electrode 40 is supplied with an AC voltage, which is derived from the AC voltage fed to electrode 38, by means of connecting line 47. For this purpose, switching means 48, formed as an operational amplifier, is used between signal line 46 and connecting line 47. It is assured in this way that electrode 38 and shielding electrode 40 are at the same potential without a time delay.

As a result of electrode 38 and shielding electrode 40 being at the same potential, no direct capacitance forms between electrode 38 and top ground electrode 28. This is formed directly by shielding electrode 40 and top ground electrode 28. Instead, an electric field extending far into the space arises between the edges of electrode 38 and the ground of ground electrode 28 and particularly a body of the motor vehicle at ground, as a result of which a large space for the detection of obstacles is available. In this case, the capacitance formed by electrode 38 and ground due to the shielding effect by shielding electrode 40 is clearly reduced compared with a direct capacitance. To measure the capacitance change during entry of an obstacle, evaluation circuit 50 is connected to electrode 38 by a connecting line 43. The evaluation circuit or the control unit connected thereto hereby detects the ratio of the capacitance change ΔC to the capacitance C. To detect the capacitance either a bridge circuit is used or the charge constant can be monitored.

Sensor 8' shown in FIG. 7 therefore is a multisensor, which combines the functions of a tactile capacitive and a non-contact capacitive sensor. Sensor 8' therefore offers high safeguarding against failure and is particularly suitable for the reliable detection of an obstacle in the closing path of an actuating element 6 of a motor vehicle 2.

LIST OF REFERENCE CHARACTERS

| List of Reference Characters | |
|---|---|
| 2 | motor vehicle |
| 4 | body |
| 6 | trunk lid |
| 8, 8' | sensor |
| 10 | control unit |
| 12, 12' | segment |
| 14 | electrode |
| 16 | counter electrode |
| 18 | anti-pinch device |
| 20 | measuring bridge circuit |
| 22 | evaluation means |
| 24 | flexible conducting structure |
| 26 | through-hole plating |
| 28, 28' | ground electrode |
| 30 | internal electrode |
| 32 | ground potential |
| 34 | feed line |
| 36 | material |
| 38 | electrode |
| 40 | shielding electrode |
| 44 | connecting line |
| 45 | signal generator |
| 46 | signal line |
| 47 | connecting line |
| 48 | switching means |
| 50 | evaluation circuit |
| A | triggering threshold |
| $C_M$, C1, C2 | measurement capacitance |
| C3, C4 | reference capacitance |
| D | axis |
| F | force |
| K | capacitance course |
| M | motor |
| $P_1, P_2$ | points |
| R | radial direction |
| $R_{el}$, R1, R2 | resistance |
| S | distance |
| V, V1 | voltage source |
| φ | opening angle |

The invention claimed:

1. An anti-pinch device for a pivotable actuating element of a motor vehicle, comprising a capacitive sensor for the non-contact detection of an obstacle in the path of the actuating element with an electrode for generating an external electric field relative to a counter electrode, whereby the electrode extends in a radial direction of the pivoting movement of the actuating element, and a control unit, which is set up to interpret a change in a measurement capacitance formed between the electrode and the counter electrode as a case of pinching, when the changed measurement capacitance exceeds a triggering threshold predefined as a function of an opening angle of the pivotable actuating element, and to track the triggering threshold, characterized in that the electrode is divided into several segments along the radial direction and that the control unit is set up to track the triggering threshold in a segment-assigned manner.

2. The anti-pinch device according to claim 1, wherein the control unit is set up to track the triggering threshold of the segments at different time intervals.

3. The anti-pinch device according to claim 1, wherein the control unit is set up to track the triggering threshold of radially inner segments at shorter time intervals than the triggering threshold of radially outer segments.

4. The anti-pinch device according to claim 1, wherein the control unit is set up to turn off individual segments as a function of the opening angle.

5. The anti-pinch device according to claim 1, wherein the control unit is set up to regulate a controllable capacitance diode in order to track the triggering threshold.

6. The anti-pinch device according to claim 1, wherein the control unit is set up to regulate a controllable series resistor in order to track the triggering threshold.

7. The anti-pinch device according to claim 1, wherein the control unit is set up to adjust a resonance frequency to track the triggering threshold.

8. The anti-pinch device according to claim 1, wherein the control unit is set up to predefine the triggering threshold as a distance value to a capacitance course of the measurement capacitance via the opening angle.

9. The anti-pinch device according to claim 8, wherein the control unit is set up to track the distance value.

10. The anti-pinch device according to claim 1, wherein the electrode is carried in a flexible carrier.

11. The anti-pinch device according to claim 10, wherein a shielding electrode is provided in addition in the flexible carrier to direct the electric field into a hazard region.

12. The anti-pinch device according to claim 11, wherein the shielding electrode is also divided into electrically contacted shielding segments, between which separate feed lines are arranged in an isolated manner.

13. The anti-pinch device according to claim 1, further comprising an additional tactile sensor.

14. The anti-pinch device according to claim 1, wherein the non-contact sensor is designed simultaneously as a tactile sensor.

15. The anti-pinch device according to claim 1, wherein the grounded body of the motor vehicle serves as a counter electrode.

16. An evaluation circuit, for an anti-pinch device according to claim 1, comprising:
measuring potential output means to output a predefined measuring potential to the electrode;
capacitance detection means to detect the measurement capacitance between the electrode and the counter electrode; and
evaluation means to output a detection signal as a function of a change in the measurement capacitance.

17. The evaluation circuit according to claim 16, wherein the measuring potential output means comprise an AC voltage source and the capacitance detection means comprise a bridge circuit, whereby the measurement capacitance in the bridge circuit is connected parallel with a controllable capacitance diode.

18. The evaluation circuit according to claim 16, wherein the measuring potential output means comprise an AC voltage source.

19. The evaluation circuit according to claim 16, wherein the capacitance detection means comprise a bridge circuit.

20. The evaluation circuit according to claim 19, wherein the measurement capacitance in the bridge circuit is connected parallel with a controllable capacitance diode.

21. The anti-pinch device according to claim 1, wherein a capacitance of each of the several segments is separately measured.

22. The anti-pinch device according to claim 21, wherein the capacitance of each of the several segments is determined using different measuring principles.

23. The anti-pinch device according to claim 1, wherein the several segments are controlled through separate feed lines.

24. A device, comprising:
an electrode extending in a radial direction of a pivoting movement of a pivotable actuating element, the electrode comprising a plurality of individual electrode segments disposed along the radial direction;
a counter electrode, wherein the electrode is configured to generate an external electric field relative to the counter electrode;
a control unit configured to interpret a change in a measurement capacitance formed between the electrode and the counter electrode, when the changed measurement capacitance exceeds a triggering threshold predefined as a function of an opening angle of the pivotable actuating element, and to track the triggering threshold,
wherein the control unit is configured to determine the measurement capacitance for each of the plurality of individual electrode segments and to compare the measurement capacitance for each of the plurality of individual electrode segments to a corresponding triggering threshold.

25. A system, comprising:
a pivotable actuating element; and
an anti-pinch device, comprising:
an electrode extending in a radial direction of a pivoting movement of the pivotable actuating element, the electrode comprising a plurality of individual electrode segments disposed along the radial direction;
a counter electrode, wherein the electrode is configured to generate an external electric field relative to the counter electrode;
a control unit configured to interpret a change in a measurement capacitance formed between the electrode and the counter electrode, when the changed measurement capacitance exceeds a triggering threshold predefined as a function of an opening angle of the pivotable actuating element, and to track the triggering threshold,
wherein the control unit is configured to determine the measurement capacitance for each of the plurality of individual electrode segments and to compare the measurement capacitance for each of the plurality of individual electrode segments to a corresponding triggering threshold.

* * * * *